United States Patent [19]

Henle et al.

[11] 4,211,934

[45] Jul. 8, 1980

[54] CURRENT-MEASURING INPUT FOR AN ELECTRONIC RELAY

[75] Inventors: Burkhard Henle, Birr; Ivica Vukasovic; Michael Fiorentzis, both of Wettingen, all of Switzerland

[73] Assignee: BBC Brown, Boveri & Company Limited, Baden, Switzerland

[21] Appl. No.: 812,600

[22] Filed: Jul. 1, 1977

[30] Foreign Application Priority Data

Jul. 8, 1976 [CH] Switzerland .................... 8742/76

[51] Int. Cl.² ........................................... G01R 15/08
[52] U.S. Cl. ..................................... 307/98; 307/100; 307/154; 324/127
[58] Field of Search .................. 307/98, 100, 131, 149, 307/154; 324/126, 127; 338/279, 280, 289–292, 220, 221, 288, 334, 49, 321

[56] References Cited

U.S. PATENT DOCUMENTS

| | | | |
|---|---|---|---|
| 1,184,706 | 5/1916 | Keller | 338/291 |
| 1,923,644 | 8/1933 | Simpson | 338/290 |
| 2,261,667 | 11/1941 | Stroszeck | 338/195 |
| 3,049,687 | 8/1962 | Berni | 338/221 |
| 3,094,678 | 6/1963 | Eisler | 338/195 |
| 3,111,641 | 11/1963 | Wilentchik | 338/221 |
| 3,470,520 | 9/1969 | Wegenberg | 338/221 |
| 3,509,511 | 4/1970 | Soroka | 338/195 |
| 3,742,947 | 7/1973 | Hashem | 250/199 |
| 3,955,138 | 5/1976 | Milkovic | 32 4/127 |
| 4,054,834 | 10/1977 | Bolrat | 324/127 |
| 4,070,572 | 1/1978 | Summerhayes | 324/96 |
| 4,075,459 | 2/1978 | Lieber | 338/290 |

OTHER PUBLICATIONS

"Pluggable Terminator Resistor Pack", A. L. Balan, IBM Technical Disclosure Bulletin, vol. 20, No. 10, Mar. 1978.

Primary Examiner—Michael L. Gellner
Assistant Examiner—S. D. Schreyer
Attorney, Agent, or Firm—Haseltine, Lake & Waters

[57] ABSTRACT

The intermediate current transformer is replaced by a shunt resistor which bridges the secondary winding of the main current transformer and is of such magnitude that the secondary winding of the main current transformer is virtually short-circuited, but the voltage at the shunt resistor is still sufficient for evaluation in the electronic relay. The shunt resistor consumes only very little power and can therefore be located in the base of a plug-in device. This base, being a permanent part of the assembly, remains in circuit even when the relay is changed or removed for inspection or testing purposes.

1 Claim, 3 Drawing Figures

CURRENT-MEASURING INPUT FOR AN ELECTRONIC RELAY

BACKGROUND OF INVENTION

The invention concerns itself with a current-measuring input for a static electronic relay fed from the secondary winding of the main current transformer.

For measuring a power line current using a static relay it has hitherto been customary to use a special intermediate current transformer between the secondary winding of the main current transfomer and the electronic relay. To obtain high-quality transfer over a wide range, transformers have been necessary which are of considerable weight and by their nature are unlike the electronic components. An added consequence has been that with a plug-in device measures have always had to be taken so that the circuit remains closed as the device is plugged in. Special plug connectors with a short-circuit link have been used for this purpose. Because in operation these were opened against a spring force, an additional means of fixing the device was necessary.

SUMMARY OF INVENTION

The object of the invention is to avoid the disadvantages of the method customary hitherto and to create for an electronic relay a current-measuring input which is compatible in volume with the electronic components and nonetheless exhibits high-quality transfer over a wide range, as well as other advantages. This object is achieved in that the intermediate current transformer is replaced by a shunt resistor which bridges the secondary winding of the main current transformer and is of such magnitude that the secondary winding of the main current transformer is virtually short-circuited, but the voltage at the shunt resistor is still sufficient for evaluation in the electronic relay.

The method proposed in the invention makes use of the fact that modern electronic components allow small voltages to be evaluated. The shunt resistor consumes only very little power and can therefore be located in the base of a plug-in device. This base, being a permanent part of the assembly, remains in circuit even when the relay is changed or removed for inspection or testing purposes. The means required hitherto for preventing interruption of the circuit (plug connectors with short-circuit link) are no longer needed.

IN THE DRAWINGS

DISCUSSION OF INVENTION

Figure 1:
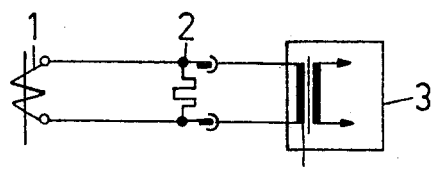
FIG. 1 is a schematic circuit of the current measuring input.

The invention will now be explained in more detail with reference to the drawings. FIG. 1 shows schematically the circuit of the current-measuring input. The secondary winding 1 of the main current transformer is bridged by the shunt resistor 2, which is so small that it virtually signifies a short circuit for the secondary winding 1, but at the same time is of such magnitude that the voltage drop occurring at it is sufficient for evaluation in the electronic relay 3. Because small voltages can be evaluated electronically, this presents no practical difficulty. The shunt resistor consumes only very little power and can therefore be located in the base of a plug-in device. This base, being a permanent part of the assembly, remains in circuit even when the relay is changed or removed for inspection or testing purposes. The means required hitherto for preventing interruption of the circuit are no longer needed.

A miniature isolating transformer 4 is sufficient to separate the electronics from the power section; this transformer has a ratio of 1:1 and compared with the bulky intermediate transformers in former configurations can be of such small volume as to be compatible with the electronic components. An optocoupler can also be used instead of a miniature isolating transformer.

Figure 2:
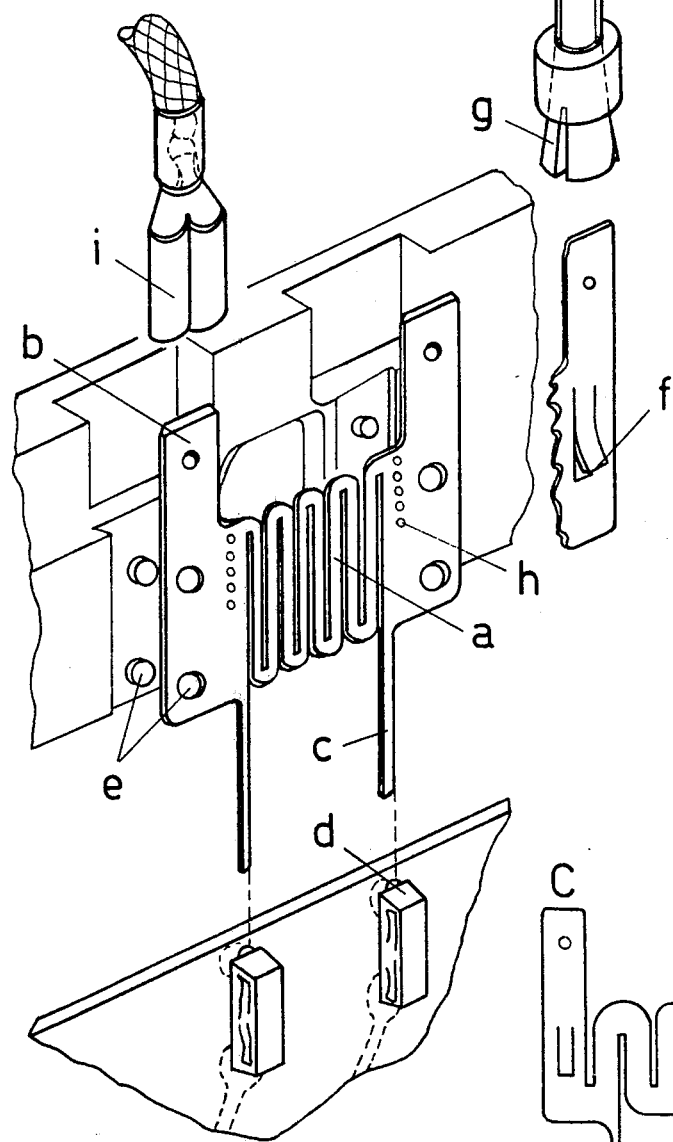
FIG. 2 is an exploded view of the elements comprising the invention.

As FIG. 2 shows, the shunt resistor a can conveniently be stamped from a flat sheet. It is of advantage if it can be connected electrically by means of flat-pin connectors 6 and is of such a form that the measuring inputs c can also be connected by way of a socket soldered direct to circuit boards d. Also recommended is a form of attachment to the base portion by means of shapes provided during stamping, e.g. holes in the sheet or spring retaining devices; the lug and hole e for fixing in the case of two-part housing, and FIG. 2 a stamped spring f retaining device are also shown. It is convenient if the resistor a stamped from flat sheet is given the required resistance value by means of a meandering shape. At places where screw terminals are specified for the current connection, it is proposed that the flat connector should be fitted with an adapter piece which allows connection to made to threaded pins; such an adapter g for screw connection as shown in FIG. 2).

Through suitably shaping the stamped figure it is possible to adjust the resistance to an exact value; the perforated section h is shown for the purpose of adjustment. To lower resistance, perforations h are filled with a high-conductivity metal. In another embodiment of the invention, the shunt resistor includes tappings, A, B and C in order to cause the same voltage drop with different currents through the resistor. It can be contained in a housing similar to a circuit board edge connector, the "cold" parts being against the housing, while the "warm" parts are in a void. The resistor can also be used with its housing both in a so-called card magazine and in a compartment for individual relays. Finally, in a further embodiment of the invention the resistor is plugged into a one-piece housing and held in position by stamped retaining springs.

Figure 3:
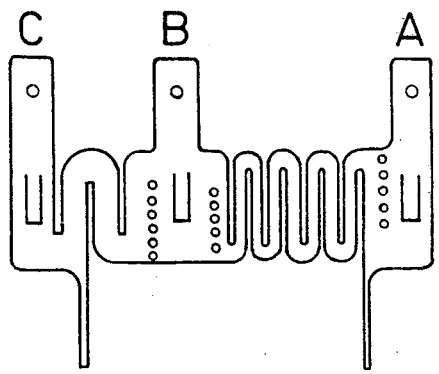
FIG. 3 is a schematic view of a resistor employed with the structure in FIG. 2.

A flat-pin socket i (see FIG. 2) is for connecting the main current transformer, and FIG. 3 schematically illustrates a resistor for nominal currents of 1 amp and 5 amp, for example, with various connections; A is a connection for 1 amp, B for 5 amp and C for 1 amp and 5 amp. By providing various connections the same voltage drop can be brought about with different currents (see above).

If a voltage transformer instead of the measuring resistor is contained in the base, the method of supplying measured values as proposed in the invention allows the same measuring device to be used for measuring current and voltage.

What we claim is:

1. A current-measuring input for an electronic evaluation unit, especially for an electronic relay fed from the secondary wnding of a main current transformer, including: a shunt resistor made of flat sheet material which bridges the secondary winding of the main current transformer, the resistor having an impedance of a value such that the secondary winding is almost short-circuited, and the voltage drop across the shunt resistor is sufficient for application to the electronic relay having adjustment means and tapping points; said shunt resistor being located in the base of a plug-in means; a miniature isolating transformer located between said shunt resistor and said electronic relay for isolating the electronics from a power section; said shunt resistor being stamped from a flat sheet; said shunt resistor being connected electrically by flat-pin connector means; said shunt resistor being formed so that the outgoing measuring contacts are connectable thereto by a socket soldered direct to circuit boards; said shunt resistor being fixed in the base by shapes provided during stamping; said shunt resistor being given a required resistance value by a serpentine shape; screw connections for electrical connection, said flat-pin connector for connecting said shunt resistor being fitted with an adapter allowing connection to be made to threaded pins; the value of the impedance of said shunt resistor being adjustable by perforations in said flat sheet material; said flat sheet material forming said shunt resistor having tape so that a voltage drop across different taps remains the same for different currents; said shunt resistor being contained in a housing corresponding substantially to a circuit board edge connector, cold parts of said resistor being against the housing while warm parts of said resistor being in a cavity; said shunt resistor with housing being usable in a card magazine; said housing being of one-piece, said shunt resistor being plugged into said housing and held in position by stamped retaining springs.

* * * * *